(12) United States Patent
Pan et al.

(10) Patent No.: US 6,284,581 B1
(45) Date of Patent: Sep. 4, 2001

(54) INTEGRATION OF BIPOLAR AND CMOS DEVICES FOR SUB-0.1 MICROMETER TRANSISTORS

(75) Inventors: Yang Pan; Erzhuang Liu, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/252,626

(22) Filed: Feb. 18, 1999

(51) Int. Cl.⁷ .................................................. H01L 21/8238
(52) U.S. Cl. ............................ 438/202; 438/234; 438/416
(58) Field of Search .................................... 438/202, 234, 438/365, 370, 364, 560, 414, 416

(56) References Cited

U.S. PATENT DOCUMENTS

| | | |
|---|---|---|
| 4,755,487 * | 7/1988 | Scovell et al. . |
| 4,902,639 | 2/1990 | Ford . |
| 5,338,696 * | 8/1994 | Ilderem et al. . |
| 5,504,362 | 4/1996 | Pelella et al. ............................ 257/357 |
| 5,606,192 | 2/1997 | Harada .................................. 257/377 |
| 5,652,154 | 7/1997 | Komuro . |
| 5,681,765 | 10/1997 | Darmawan . |
| 5,793,085 | 8/1998 | Vajana et al. ............................ 257/370 |

OTHER PUBLICATIONS

Higashitani et al., "Submicron CBiCMOS Technology with New Well and Buried Layer Formed by Multiple Energy Ion Implantation", IEEE Custom Integrated Circuits Conference, 1991, pp. 18.4.1–18.4.4.*

* cited by examiner

Primary Examiner—Tuan H. Nguyen
(74) Attorney, Agent, or Firm—George O. Saile; Rosemary L. S. Pike; George S. Jones, II

(57) ABSTRACT

Form a semiconductor device with dielectric, isolation structures in a top surface of a silicon semiconductor substrate, separating the substrate into emitter, NMOS and PMOS areas. Form a gate oxide layer above the isolation structures on the top surface of the silicon semiconductor substrate. Form a conductive polysilicon layer above the thin silicon oxide layer. Mask the NMOS and PMOS regions of the substrate with an emitter mask having a window over the emitter area of the substrate. Ion implant emitter dopant into a portion of the conductive polysilicon layer over the emitter area of the substrate through the window in the emitter mask. Strip the emitter mask. Anneal the substrate including the thin silicon oxide layer, and the polysilicon layer to drive the dopant into an emitter region in the emitter area in the substrate. Form doped source/drain regions and a base in the emitter area of the substrate.

12 Claims, 6 Drawing Sheets

INTEGRATION OF BIPOLAR AND CMOS DEVICES FOR SUB-0.1 MICROMETER TRANSISTORS

BACKGROUND OF THE INVENTION

1. Field of the Invention

This invention relates to semiconductor devices and more particularly to BiCMOS transistor devices and methods of manufacture thereof.

2. Description of Related Art

U.S. Pat. No. 5,793,085 of Vajana et al. for "Bipolar Transistor Compatible with CMOS Processes" shows a BiCMOS process with ion implanted source/drain and base regions.

U.S. Pat. No. 5,681,765 of Darmawan for "Process for Fabricating Single Polysilicon High Performance BiCMOS" shows a BiCMOS processes with a patterned photoresist layer 80 with an opening above a polysilicon layer 78 with a thickness of about 3250 Å. Dopant 44 is implanted through the opening in the photoresist layer to form a base-emitter region 84 for an eventual bipolar transistor in a tub 68 in an epitaxial layer 60.

U.S. Pat. No. 5,606,192 of Harada for "Semiconductor Integrated Circuits Having Bipolar Transistors and LDD-Structured MOSFET" show BiCMOS processes with polysilicon layers and ion implanting boron ions to form an N-type region in a polysilicon emitter electrode layer 23 formed above a gate oxide layer 12, which in turn is formed above a base layer 19 formed in an N-type epitaxial layer 4 in a P-silicon substrate 1.

U.S. Pat. No. 4,902,639 of Ford for "Process for Making BiCMOS Integrated Circuit Having a Shallow Trench Bipolar Transistor with Vertical Base Contacts" describes a BiCMOS process, but makes a reference to the NMOS region 27 at Col. 3, lines 23–41, to an intermediate stage of manufacturing the NMOS region 27. A second polysilicon layer is deposited on a previous polysilicon layer. The second polysilicon layer is then heavily doped to become a poly-silicon N+ layer with an N+ dopant. Alternatively the polysilicon is deposited as a heavily doped layer by an in situ process. Then in NMOS region 27, using a portion of the second polysilicon layer which is now heavily doped polysilicon N+ layer 40, a buried contact region 41 is formed in a P-well region 16 by diffusion, as the result of a high temperature anneal. In Col. 4, lines 4–43, a trench is formed where the NPN transistor is to be formed. First an active base region 67 is formed by implanting boron in the N-well 19. Oxide sidewalls 68 are formed in the trench. A polysilicon emitter 69 is deposited in the trench between the oxide sidewalls 68. Then emitter 69 is doped N-type using masks and implants. By this process or an anneal, a very shallow N-type emitter junction is formed in the active base region from the doping of the polysilicon emitter 69.

U.S. Pat. No. 5,504,362 of Pelella et al., "Electrostatic Discharge Protection Device" in Cols. 7 and 8 and FIG. 2 teaches out diffusion from N+ polysilicon emitter contact 48/P+ polysilicon base contact 44 to form N+ emitter out diffusion region 39/P+ base out diffusion region 40 of an NPN bipolar transistor 15C in a BiCMOS device.

U.S. Pat. No. 5,652,154 of Komuro for "Method for Manufacturing BiCMOS Device" shows a process for manufacturing a BiCMOS device. At Col. 5, lines 7–37, an intrinsic base region 109 is formed by ion implantation of a P-type dopant comprising boron into an N-type silicon region C of a P-type silicon substrate 101. Later in the process there is an ion implantation of the polysilicon layer which is first " modified to have an N-type conductivity" by driving dopant from a doped glass layer or by ion implanting N-type dopant into the polysilicon. Then the doped polysilicon is formed into gate electrodes 112a–112c which are to be used to form FET devices in areas A and B and a bipolar device in area C. Then". . . in area C, the polysilicon layer is left as an emitter electrode 112c above an emitter diffused region forming area for the bipolar transistor." The next step is a heat treatment step employed to form an N-type emitter region 113 in the P type intrinsic region 109. (Col. 5, lines 38–59).

SUMMARY OF THE INVENTION

When the gates of CMOS transistors are scaled to less than 100 nm, the gate oxide thicknesses will be around 5 Å to 40 Å. Under such circumstances, the gate structures of bipolar devices and MOS devices become more similar than the large geometry devices.

In accordance with this invention, a simple approach to the method of manufacture and the structure of bipolar devices and MOS devices is provided. The proposed invention is very compatible with CMOS process with minimum additional steps to form the self-aligned bipolar transistors in a standard CMOS process.

In accordance with the method of this invention a semiconductor device is formed with dielectric, isolation structures in a top surface of a silicon semiconductor substrate, separating the substrate into a plug area, an emitter area, an NMOS area and a PMOS area. The plug area is juxtaposed with the emitter area away from the NMOS area and the PMOS area. Form a buried doped layer for a bipolar transistor in the plug area and the emitter area of the substrate deep below the surface. Form a collector plug region in the plug area, reaching from the surface of the substrate to reach the buried doped layer. Form a gate oxide layer superjacent to the isolation structures on the top surface of the silicon semiconductor substrate. Form a conductive polysilicon layer superjacent to the thin silicon oxide layer. Mask the NMOS and PMOS regions of the substrate with an emitter mask having a window over the emitter area of the substrate. Ion implant emitter dopant into a portion of the conductive polysilicon layer over the emitter area of the substrate through the window in the emitter mask. Strip the emitter mask. Anneal the substrate including the thin silicon oxide layer, and the polysilicon layer to drive the dopant into an emitter region in the emitter area in the substrate. Form doped source/drain regions and a base in the emitter area of the substrate. Preferably, the annealing is performed by rapid thermal annealing. The isolation structures are trenches formed in the substrate filled with silicon oxide dielectric. The gate oxide has a thickness from about 5 Å to about 40 Å.

BRIEF DESCRIPTION OF THE DRAWINGS

The foregoing and other aspects and advantages of this invention are explained and described below with reference to the accompanying drawings, in which:

FIG. 13 shows a sectional, elevational view of a fragment of the semiconductor device in accordance with this invention.

DESCRIPTION OF THE PREFERRED EMBODIMENT

The invention teaches a BiCMOS process for manufacture of a bipolar transistor in a standard CMOS process.

Figure 5:
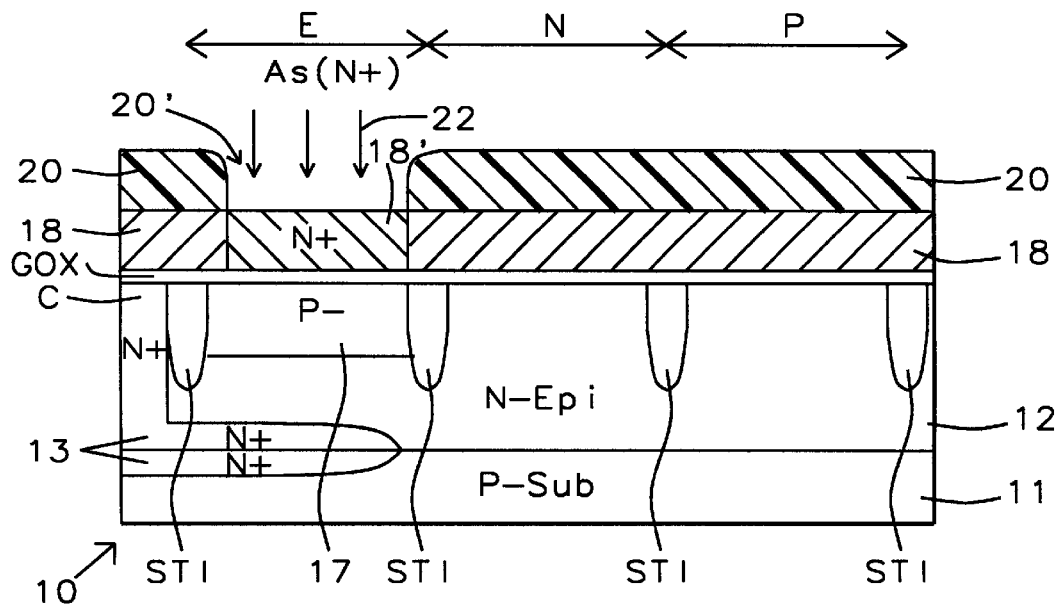
Figure 6:
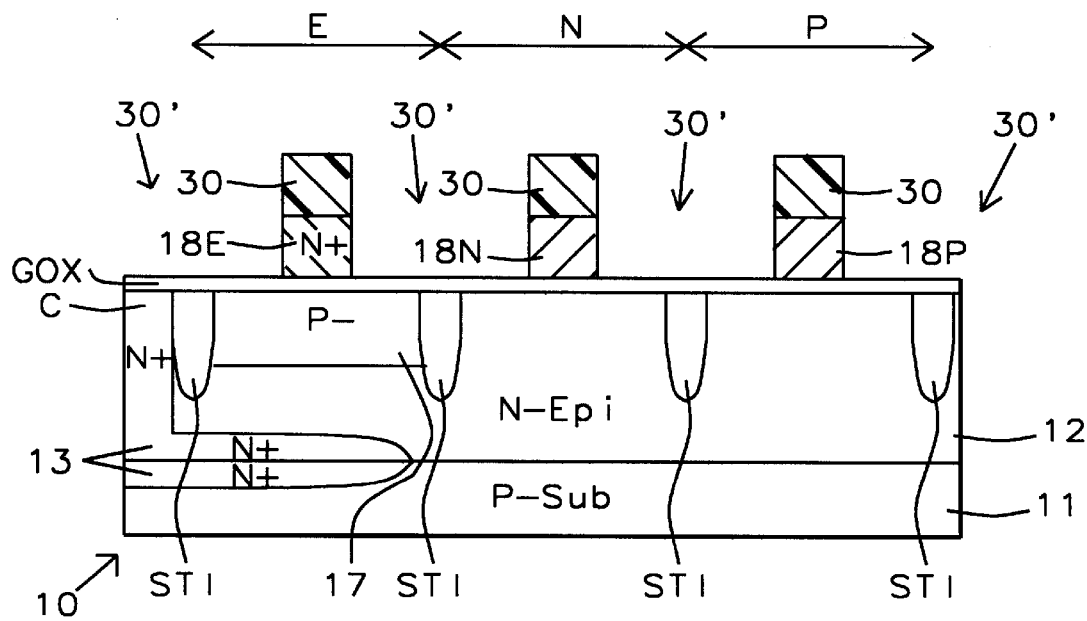
Figure 7:
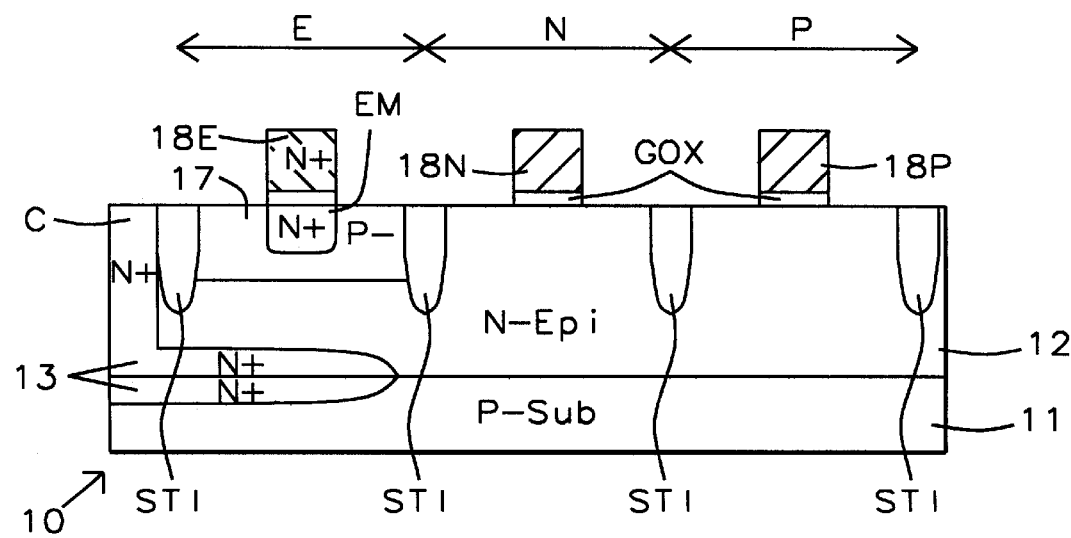

Referring to FIGS. 5–7, a fragment of a semiconductor device 10, in accordance with this invention, is shown in an early stage of manufacture. In this stage of the process of the invention shown in FIG. 5, a step is performed of implantation of N type dopant through a bipolar polysilicon emitter opening 20' in a mask 20 to form an N+ doped emitter portion 18' of a polysilicon layer 18. Next, in FIG. 6, the polysilicon is being patterned into N+ doped emitter portion 18E and gate electrodes 18N and 18P. In FIG. 7, the device 10 has been annealed causing formation of an emitter region EM in the silicon semiconductor substrate 12 of the device 10 below the emitter portion 18'.

Process Flow

1) Form STI Isolation Structures and other Front End Processing.

Figure 1:
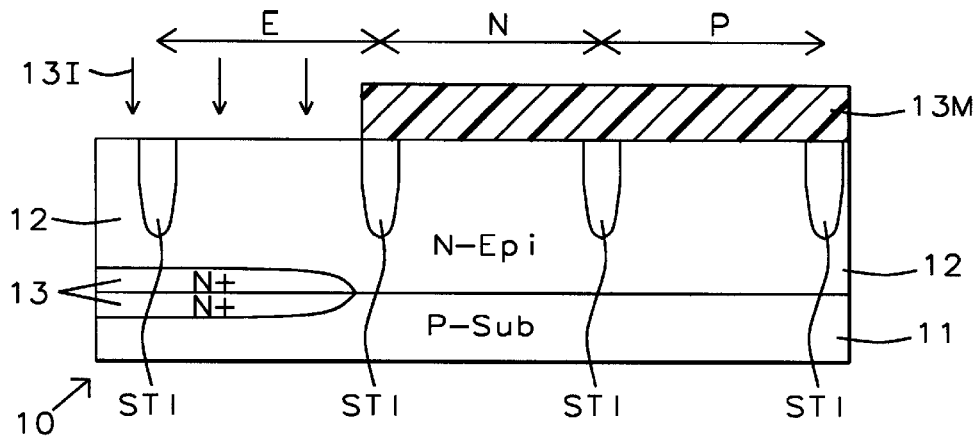
FIGS. 1–13 show a sectional, elevational view of a fragment of a semiconductor device in accordance with this invention, in various stages of the manufacturing process.

FIG. 1 shows a sectional, elevational view of a fragment of a semiconductor device 10 in accordance with this invention in an early stage of manufacture. Semiconductor device 10 includes a P– doped silicon semiconductor substrate 11 on which an N– doped epitaxial (N-Epi) silicon semiconductor layer 12 has been formed.

In N-Epi layer 12, four Shallow Trench Isolation structures STI formed in four equally spaced trenches are shown illustrating a structure in accordance with this invention. Isolation structures STI are filled with silicon dioxide dielectric. The isolation structures STI reach down from the surface of the N-Epi layer 12 to a substantial depth.

The isolation structures STI are provided to isolate the emitter area E which is located on the left end of device 10 from the NMOS area N which is located in the middle of device 10. Area N is also isolated from the PMOS area P which is located on the right end of device 10.

The emitter area E is located between the first and second of the four isolation structures STI from the left. The NMOS area N is between the second and third of the four isolation structures STI from the left. The PMOS area P is between the third and fourth of the four isolation structures STI from the left.

In FIG. 1, a mask 13M has been formed on the surface of N-Epi layer 12 covering the three of the four isolation structures STI from the right, thus exposing the emitter area E between the first and second of the four isolation structures STI from the left. This permits deep implantation of N+ ions 13I in device 10 to form an N+ buried region 13 located both above and below the interface, i.e. straddling the interface between the P-sub 11 and the N-Epi layer 12. In accordance with a typical BiCMOS process, the BiCMOS devices are formed in a wafer of silicon 11 with a superjacent N– epitaxial layer 12 with an N+ buried region 13 for an NPN transistor formed in an early part of the process, as shown in FIG. 1. The N+ dopant ions 13I can be Antimony (Sb) or Arsenic (As). The dose and the energy level of ions 13I implanted to form N+ doped buried region 13 and the concentration of dopant in N+ doped buried region 13 are all within conventional ranges, as will be well understood by those skilled in the art.

2) Form N+ Collector Plug

Figure 2:
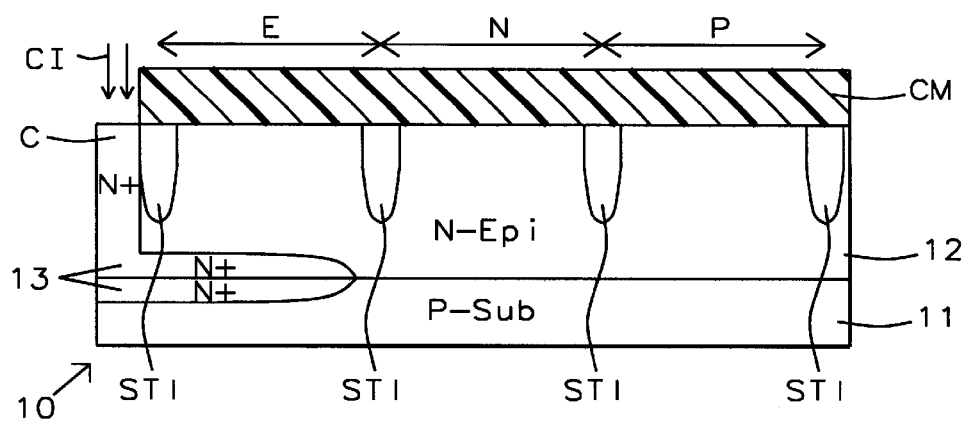

In FIG. 2, the device 10 of FIG. 1 is shown after a mask CM has been formed on the surface of N-Epi layer 12 covering the four isolation structures STI from left of the first isolation structure STI and extending to right. The purpose is to expose an area to the left of the emitter area E to permit implantation of N+ ions CI to form N+ collector plug C to the left of the leftmost isolation structure STI extending from the top surface of N-Epi layer 12 superjacent to and in direct contact with the top surface of the buried N+ region 13. The dose and the energy level of ions implanted to form collector plug C and the concentration of dopant collector plug C are conventional, as will be well understood by those skilled in the art.

3) Grow Gate Oxide

Figure 3:
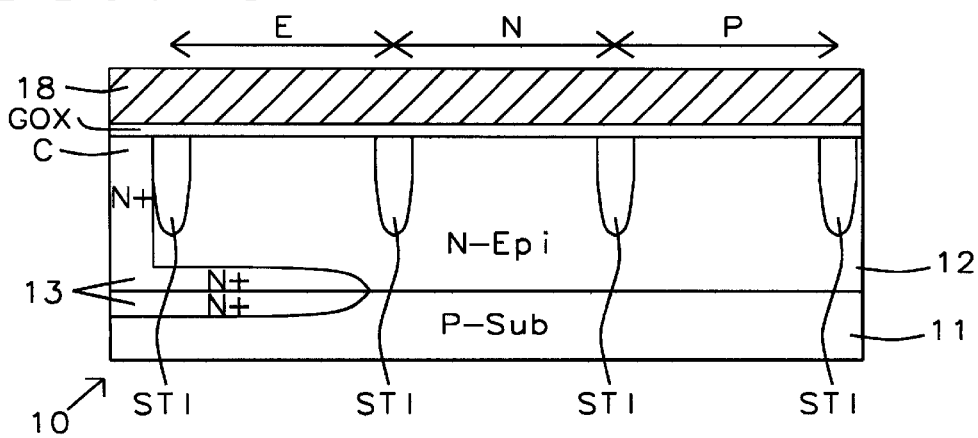

In FIG. 3, the device 10 of FIG. 2 is shown after a blanket gate oxide layer GOX was formed superjacent to and in contact with the the top surface of N-Epi layer 12 and the isolation structures STI, i.e. covering N-Epi layer 12 and isolation structures STI. The gate oxide layer GOX is a thin silicon oxide layer having a thickness from about 5 Å to about 40 Å.

4) Form Polysilicon Layer

The device 10 of FIG. 3 also includes a blanket layer of polysilicon 18 was formed superjacent to the gate oxide layer GOX in a subsequent step in a conventional process of fabrication, as will be well understood by those skilled in the art. Polysilicon layer 18 has a thickness typical of the polysilicon employed in FET gate electrodes.

5) Form Mask for Bipolar Transistor Emitter

Figure 4:
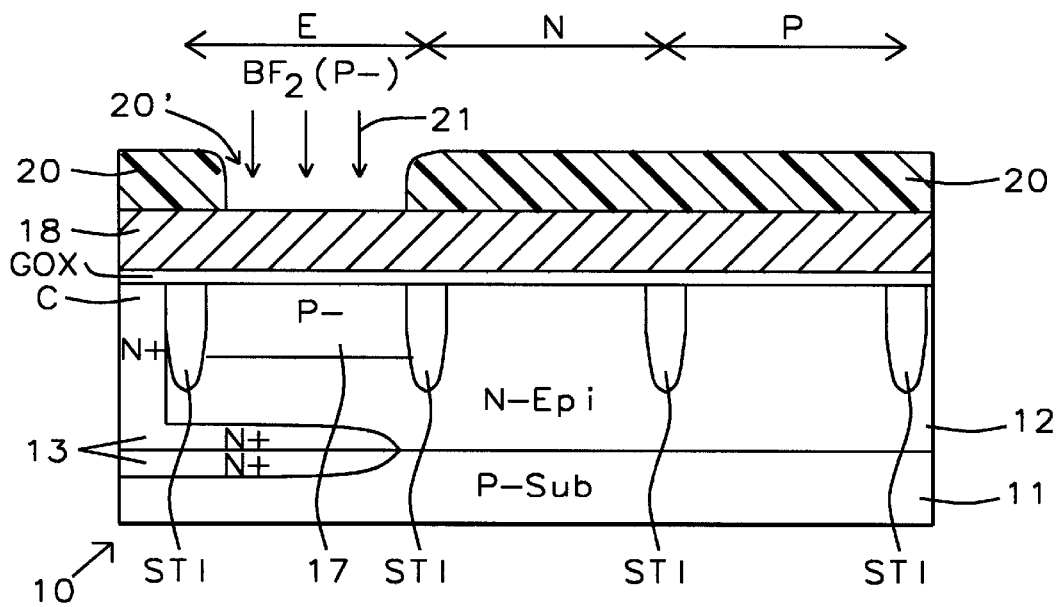

In FIG. 4, the device 10 of FIG. 3 is shown after a photoresist doping mask 20 has been formed superjacent to the blanket layer of polysilicon 18 exposing the surface of polysilicon layer 18, between the first and second STI regions from the left to forms a shallow P– region 17 in the surface of N-Epi layer 12. Mask 20 includes a window 20' between the leftmost two of the four isolation structures STI shown in the emitter area E of the N-Epi layer 12. Ion implantation of boron difluoride ($BF_2$) dopant ions 21 is performed with an energy sufficient to plant the ions 21 in the N-Epi layer 12, below the gate oxide layer GOX. This forms the shallow P– region 17 in the surface of N-Epi layer 12 between the first and second STI regions from the left. The dose and the energy level of ions 21 implanted and the concentration of dopant are conventional, as will be well understood by those skilled in the art.

6) Implant Polysilicon for Bipolar Transistors Only

In FIG. 5, the device 10 of FIG. 4 is shown (with the mask 20 of FIG. 4 remaining in place) while the N+ doped portion 18' of polysilicon 18 (above P– doped region 17 in the emitter area E of N-Epi layer 12) is being ion implanted, through window 20' in mask 20, with N+ ions 22 at an energy from about 20 keV to about 50 keV. The dose of arsenic (N+) dopant ions 22 from about 1 E 15 ions/$cm^{-2}$ to about 1 E 16 ions/$cm^{-2}$ results in a concentration at this stage of the process from about 1 E 19 atoms/$cm^{-3}$ to about 1 E 21 atoms/$cm^{-3}$.

7) Pattern Emitter and CMOS Gates

In FIG. 6, the device 10 of FIG. 5 is shown after formation of a patterning mask 30 with four large windows 30' therethrough over the polysilicon layer 18 including the portion 18' and used for etching to form an NPN N+ doped emitter portion 18E and CMOS gates 18N and 18P. The four windows 30' of patterning mask 30 are centered over isolation structures STI. Using mask 30 the polysilicon layer 18 has been etched through windows 30' down to the gate oxide layer GOX. The results are N+ doped polysilicon emitter portion 18E formed from N+ doped portion 18' over emitter area E of the N-Epi layer 12, the NMOS gate electrode 18N formed over the N area of N-Epi layer 12 and the PMOS gate electrode 18P formed over the P area of N-Epi layer 12.

8) Rapid Thermal Anneal (RTA) to Drive-in Emitter Dopant

In FIG. 7, the device 10 of FIG. 6 is shown after etching away portions of the gate oxide layer GOX unprotected by the N+ doped polysilicon emitter portion 18E, the NMOS gate electrode 18N and the PMOS gate electrode 18P.

Next, performance of a rapid thermal annealing process drives the dopant in polysilicon emitter portion 18E down through the portion of gate oxide layer GOX remaining below N+ doped polysilicon emitter portion 18E into a new emitter substrate N+ doped region EM forming in N-Epi layer 12 as a part of the NPN device. N+ doped region EM is self-aligned with the N+ doped polysilicon emitter portion 18E.

9) Form PLDD/PLDS Regions for Bipolar Base and PMOS Regions

Figure 8:
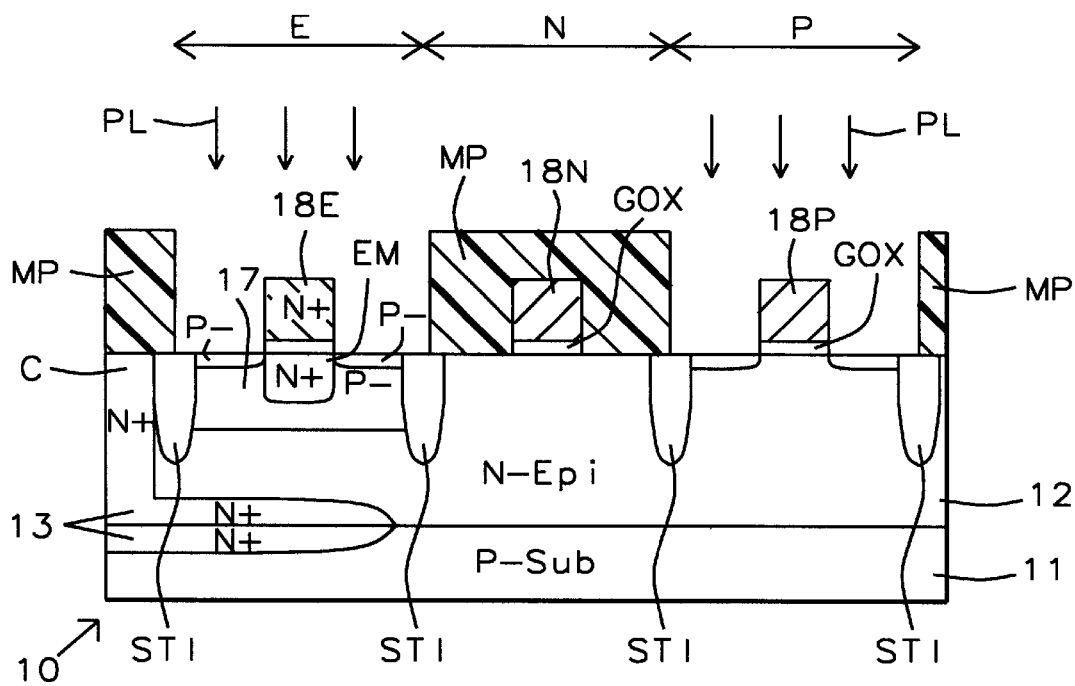

In FIG. 8, device 10 of FIG. 7 is shown after formation of a mask MP exposing the upper surfaces of areas E and P but covering area N during ion implantation of a light dose of P-type boron dopant ions PL into lightly doped drain/source (LDD/LDS) regions P− have been formed for the N+ doped polysilicon emitter portion 18E and gate 18P, self-aligned with both thereof. Dopant ions PL are implanted at an energy from about 0.1 keV to about 50 keV, with a dose from about 1 E 17 ions/cm$^{-2}$ to about 5 E 14 ions/cm$^{-2}$ of resulting in a concentration at this stage of the process from about 1 E 16 atoms/cm$^{-3}$ to about 5 E 18 atoms/cm$^{-3}$.

10) Form P+ Regions for bipolar base and PMOS Regions

Figure 9:
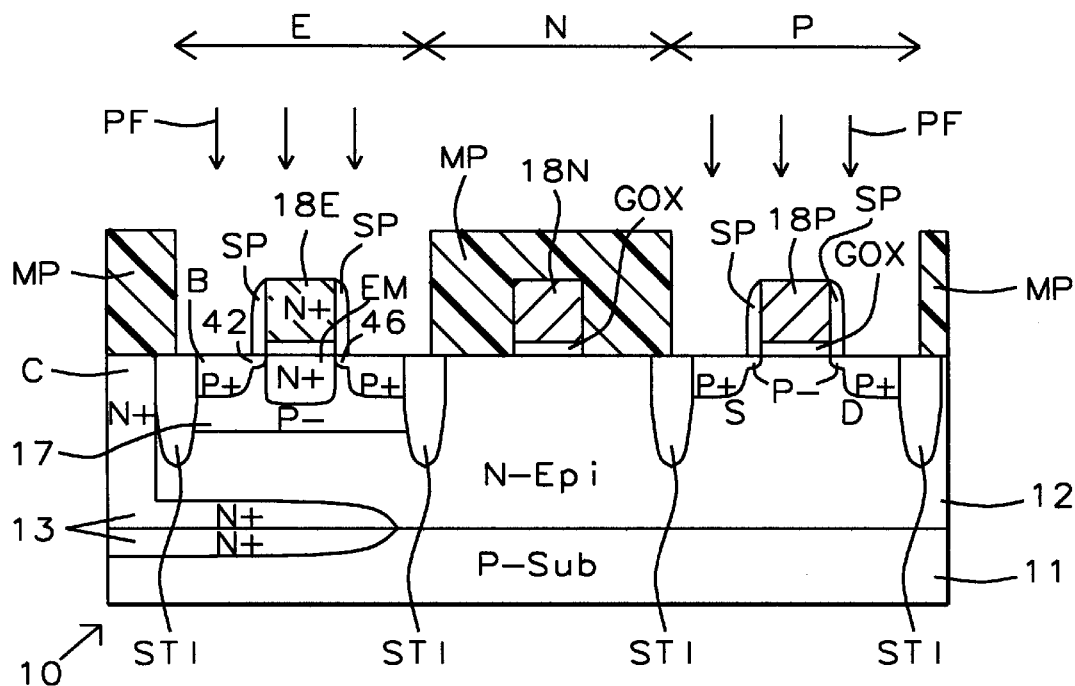

In FIG. 9, device 10 of FIG. 8 is shown with the mask MP remaining after formation of spacers SP on the sides of the polysilicon emitter portion 18E and gate electrode 18P, covering areas on either side of the emitter portion 18E and gate electrode 18P exposing narrower portions of the top surfaces of areas E and P during ion implantation of a full dose of P-type dopant PF for the N+ doped polysilicon emitter portion 18E and gate electrode 18P. Preferably, boron dopant ions PF are implanted with a dose from about 1 E 15 ions/cm$^{-2}$ to about 1 E 16 ions/cm$^{-2}$ at an energy from about 0.1 keV to about 50 kev. A concentration from about 1 E 19 atoms/cm$^{-3}$ to about 1 E 21 atoms/cm$^{-3}$ results at this stage of the process.

The result is a P+ base region B, and a P+ doped region 44 self-aligned with the spacers SP adjacent to emitter portion 18E plus P+ S/D regions self-aligned with the spacers SP adjacent to gate electrode 18P. P+ base region B and P− doped region 41 are located to the left of the emitter portion 18E. P+ doped region 44 and P− doped region 46 are located to the right of the emitter portion 18E. P+ S/D regions and lightly doped (LDD/LDS) regions P− are located to the left and right of the gate electrode 18P in the conventional manner for a PMOS device.

11) Form NLDD/NLDS Regions for the NMOS Regions

Figure 10:
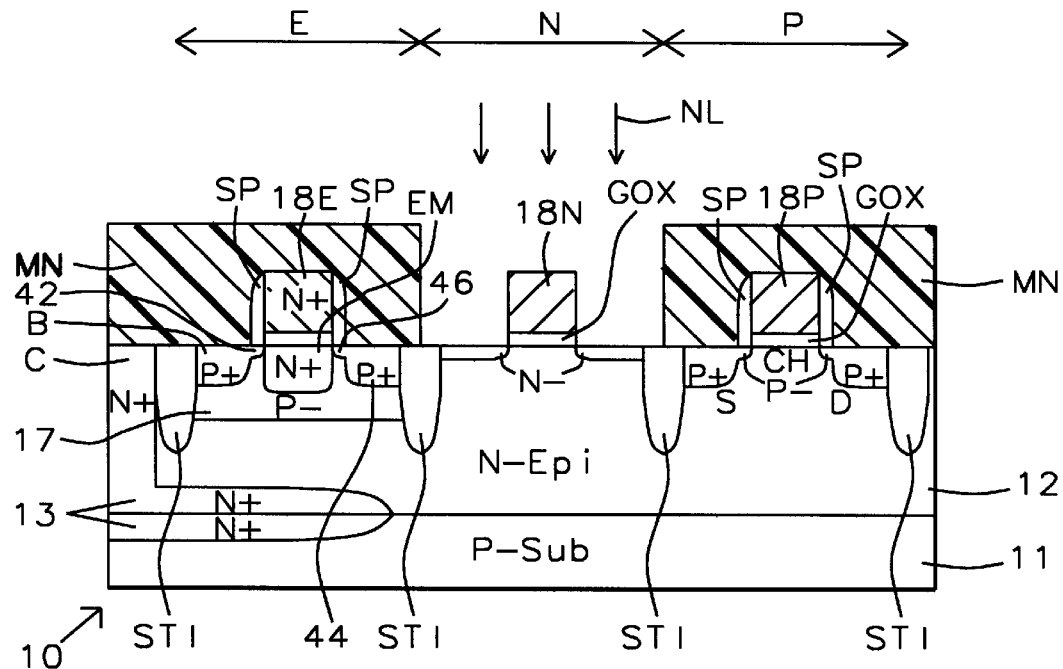

In FIG. 10, device 10 of FIG. 9 is shown after formation of a mask MN exposing the upper surfaces of area N, and covering areas E and P during ion implantation of a light dose of N-type dopant NL lightly doped drain/source (LDD/LDS) N-regions N− have been formed on the left and right of the gate 18N, self-aligned therewith. The dopant NL is preferably arsenic (As) or phosphorus (P) dopant ions implanted with a dose from about 1 E 12 ions/cm$^{-2}$ to about 5 E 14 ions/cm$^{-2}$ of at an energy from about 0.1 keV to about 50 kev. At this stage of the process a dopant concentration from about 1 E 16 atoms/cm$^{-3}$ to about 5 E 18 atoms/cm$^{-3}$ results.

12) Form N+ Regions for NMOS Regions

Figure 11:
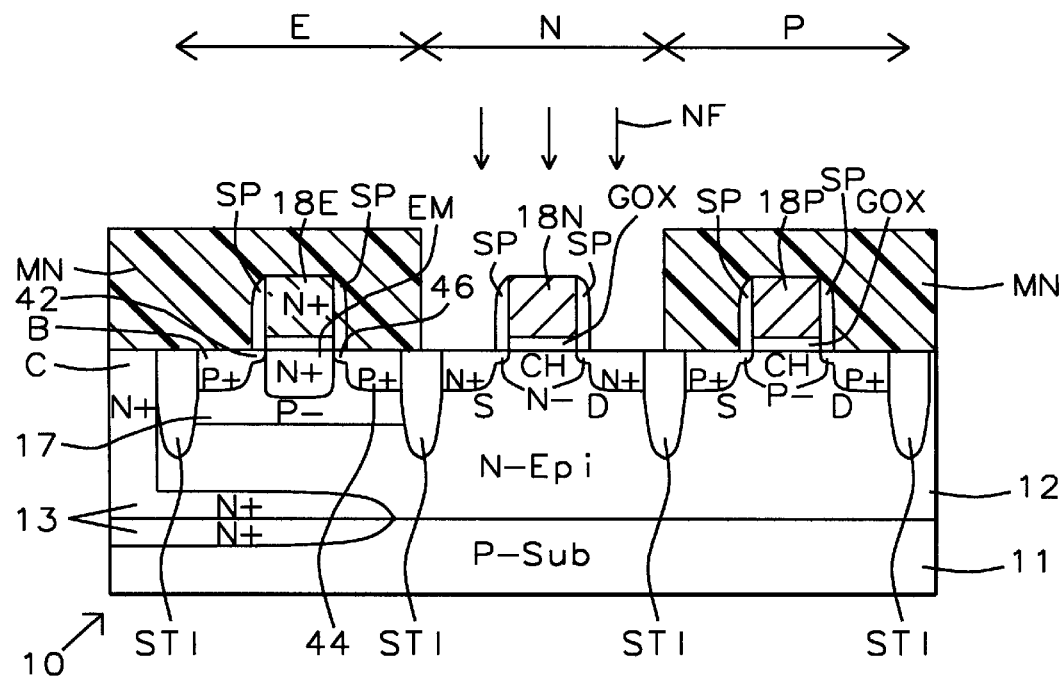

In FIG. 11, the device 10 of FIG. 10 is shown with mask MN remaining after formation of spacers SP on the sides of electrode 18N, exposing the upper surfaces of area N during ion implantation of a full dose of N-type dopant NF for the formation of source/drain regions S/D of gate electrode 18N self-aligned with the spacers SP. Dopant NF is preferably arsenic (N type) dopant ions implanted at an energy from about 0.1 keV to about 50 keV at a dose from about 1 E 15 ions/cm$^{-2}$ to about 1 E 16 ions/cm$^{-2}$, resulting in a concentration from about 1 E 19 atoms/cm$^{-3}$ to about 1 E 19 atoms/cm$^{-3}$.

N+ S/D regions and lightly doped (LDD/LDS) regions N− are located to the left and right of the gate electrode 18N in the conventional manner for an NMOS device.

13) Strip Mask

Figure 12:
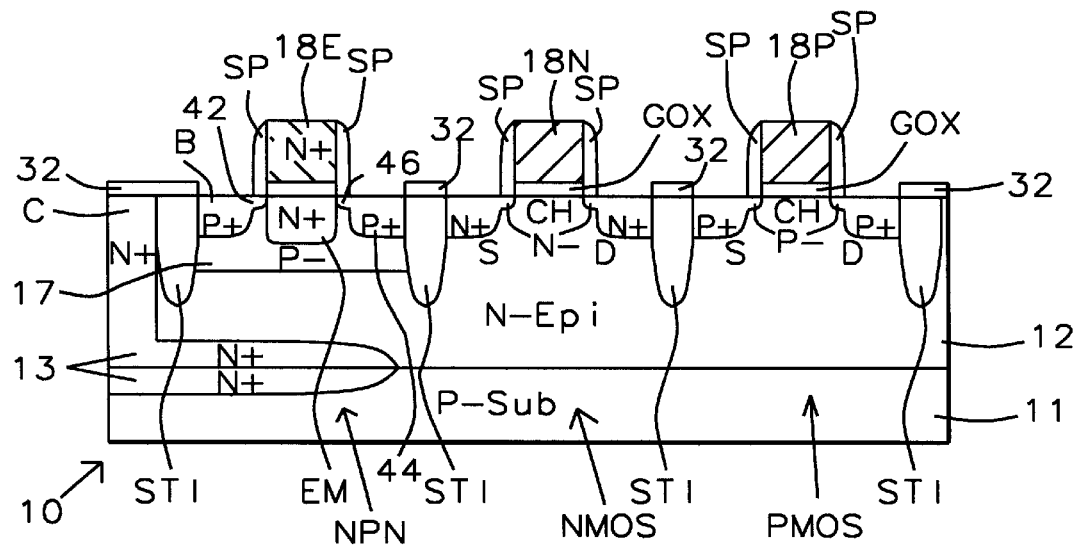

In FIG. 12, the device 10 of FIG. 11 is shown after mask MN has been stripped from device 10. The NPN transistor area includes the P+ doped regions 40 and 44 spaced by the spacers from the emitter portion 18E and the P− lightly doped regions 42 and 46 located below the spacers. The N+ emitter region E is located between the P− lightly doped regions 42/44. A thin oxide layer 32 has been formed superjacent to (over) the collector region C in N-Epi layer 12 and over the STI regions (aside from the P+/N+ regions of the device 10).

14) Backend Process

Figure 13:
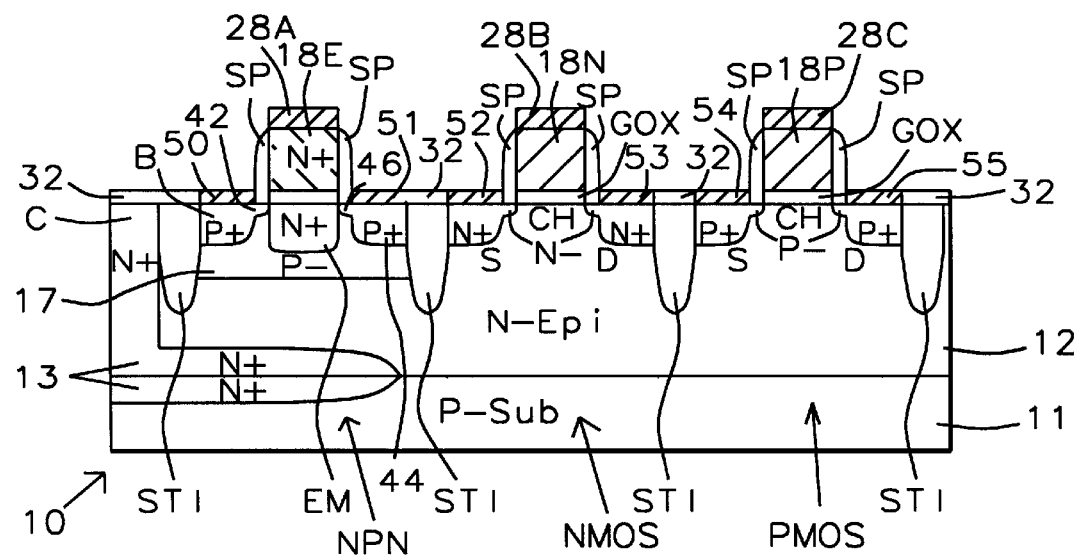

In FIG. 13, the device 10 of FIG. 12 is shown after conductive regions 50, 51, 52, 53, 54 and 55 composed of of titanium suicide (TiSi$_x$) have been formed over the N+/P+ regions of device 10 for the purpose of reducing resistance.

In addition, titanium suicide (TiSi$_x$, where x is preferably a positive integer 2, i.e. TiSi$_2$) layers 28A have been formed over the polysilicon emitter portion 18E and gate electrodes 18N and 18P.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a semiconductor device on a semiconductor substrate having a top surface providing an interface on which an epitaxial semiconductor layer is formed, said epitaxial semiconductor layer having an upper surface, said method comprising the steps as follows:

forming dielectric, isolation structures in said epitaxial layer extending downwardly from said upper surface said isolation structures separating said epitaxial layer into a bipolar area, an NMOS area and a PMOS area, then forming a buried doped region for a bipolar transistor in said substrate and in said epitaxial semiconductor layer at the bottom of said emitter area deep below said upper surface straddling said interface, then forming a thin silicon oxide layer superjacent to said isolation structures on said top surface of said silicon semiconductor substrate, forming a conductive polysilicon layer superjacent to said thin silicon oxide layer, masking said NMOS and PMOS areas of said substrate with a bipolar mask having a window over said bipolar area of said substrate, ion implanting bipolar dopant into a portion of said conductive polysilicon layer over said bipolar area of said substrate through said window in said bipolar mask, stripping said bipolar mask, annealing said substrate including said thin silicon oxide layer, and said polysilicon layer to drive said dopant into a bipolar region in said bipolar area in said substrate, and forming doped source/drain regions and a bipolar base in said bipolar area of said substrate.

2. The method of claim 1 wherein said annealing is performed by rapid thermal annealing.

3. The method of claim 1 wherein said thin silicon oxide layer comprises a gate oxide layer having a thickness from about 5 Å to about 40 Å.

4. The method of claim 1 wherein:

said annealing is performed by rapid thermal annealing, and said thin silicon oxide layer comprises a gate oxide layer having a thickness from about 5 Å to about 40 Å.

5. The method of claim 1 wherein said isolation structures are trenches formed in said substrate filled with silicon oxide dielectric.

6. A method of forming a semiconductor device on a silicon semiconductor substrate which is doped having a top surface providing an interface on which an epitaxial silicon semiconductor layer that is counterdoped, said epitaxial semiconductor layer having an upper surface, said method comprising the steps as follows:

forming dielectric, shallow trench isolation structures in the upper-surface separating said substrate into a plug area, an emitter area, an NMOS area and a PMOS, area, said plug area being juxtaposed with said emitter area located on a side of said emitter area away from said NMOS area and said PMOS area, then forming a buried doped region proximate to said interface for a bipolar transistor at the bottom of said plug area and at the bottom of said emitter area and in the confronting surface of said substrate deep below said surface of said epitaxial silicon semiconductor layer located straddling said interface and spaced well below said upper surface, then forming a collector plug region in said plug area, extending from said upper surface to reach said buried doped layer, then forming a gate oxide layer superjacent to said isolation structures on said upper surface, forming a conductive polysilicon layer on said gate oxide layer, forming a lightly counter doped region in said emitter area below said upper surface, masking said NMOS and PMOS areas of said substrate with an emitter mask having a window over said emitter area of said substrate, ion implanting emitter dopant into a portion of said conductive polysilicon layer over said emitter area of said substrate through said window in said emitter mask, stripping said emitter mask, patterning an emitter conductor over said emitter area and CMOS gates over said NMOS and PMOS areas from said conductive polysilicon layer, annealing said substrate including said gate oxide layer, and said conductive polysilicon layer to drive said emitter dopant into an emitter region in said emitter area in said epitaxial silicon semiconductor layer, and forming doped source/drain regions in said NMOS area and said PMOS area and forming a base region adjacent to said emitter region in said emitter area of said substrate.

7. The method of claim 6 wherein said annealing is performed by rapid thermal annealing.

8. The method of claim 6 wherein said gate oxide layer has a thickness from about 5 Å to about 40 Å.

9. The method of claim 6 wherein:

said annealing is performed by rapid thermal annealing, and said gate oxide layer has a thickness from about 5 Å to about 40 Å.

10. The method of claim 6 wherein said isolation structures are trenches formed in said substrate filled with silicon oxide dielectric.

11. A method of forming a semiconductor device on a silicon semiconductor substrate which is P-doped having a top surface providing an interface on which an epitaxial silicon semiconductor layer that is counter N− doped, said epitaxial semiconductor layer having an upper surface, said method comprising the steps as follows:

forming dielectric, shallow trench isolation (STI) structures filled with silicon oxide dielectric in said epitaxial layer, said STI structures extending downwardly from said upper surface to provide separate areas including a plug area, a emitter area, an NMOS area and a PMOS area, with said plug area being juxtaposed with said emitter area located on a side of said emitter area away from said NMOS area and said PMOS area, then forming a buried doped N+ region for a bipolar transistor straddling said interface in both said plug area and said emitter area of said epitaxial layer and deep below said upper surface and in said substrate proximate to said interface and spaced well below said upper surface, then forming an N+ collector plug region in said plug area, extending from said surface of said substrate to reach said buried doped layer, then forming a gate oxide layer superjacent to said isolation structures on said top surface of said counterdoped epitaxial silicon semiconductor layer having a thickness from about 5 Å to about 40 Å, forming a conductive polysilicon layer over said gate oxide layer, forming a lightly counter doped region in said emitter area below said surface, masking said NMOS and PMOS areas of said substrate with an emitter mask having a window over said emitter area of said substrate, ion implanting emitter dopant into a portion of said conductive polysilicon layer over said emitter area of said substrate through said window in said emitter mask, stripping said emitter mask, patterning an emitter conductor over said emitter area and CMOS gates over said NMOS and PMOS areas from said conductive polysilicon layer, annealing said substrate including said gate oxide layer, and said conductive polysilicon layer to drive said emitter dopant into an emitter region in said emitter area in said substrate performed by Rapid Thermal Annealing (RTA), and forming doped source/drain regions in said NMOS area and said PMOS area and forming a base region adjacent to said emitter region in said emitter area of said substrate.

12. The method of claim 1 wherein said buried doped N+ region is doped with a dopant selected from antimony and arsenic.

* * * * *